United States Patent
Cong et al.

(10) Patent No.: US 11,313,917 B2
(45) Date of Patent: Apr. 26, 2022

(54) ELECTRIC CURRENT SENSOR FOR DETECTING LEAKAGE CURRENT

(71) Applicant: Lear Corporation, Southfield, MI (US)

(72) Inventors: Steven Cong, Novi, MI (US); David A Hein, Sterling Heights, MI (US); Ajmal Imran Ansari, Canton, MI (US); Anthony Armento, Berkley, MI (US); Arthur Hurlburt, Canton, MI (US); Ryan Cleveland, Southfield, MI (US); Matthew Zamieski, Royal Oak, MI (US)

(73) Assignee: LEAR CORPORATION, Southfield, MI (US)

( * ) Notice: Subject to any disclaimer, the term of this patent is extended or adjusted under 35 U.S.C. 154(b) by 0 days.

(21) Appl. No.: 15/929,620

(22) Filed: May 13, 2020

(65) Prior Publication Data

US 2021/0356531 A1 Nov. 18, 2021

(51) Int. Cl.
*G01R 31/52* (2020.01)
*G01R 15/20* (2006.01)
*G01R 19/00* (2006.01)

(52) U.S. Cl.
CPC .......... *G01R 31/52* (2020.01); *G01R 15/205* (2013.01); *G01R 19/0092* (2013.01)

(58) Field of Classification Search
CPC ... G01R 31/52; G01R 19/0092; G01R 15/205
See application file for complete search history.

(56) References Cited

U.S. PATENT DOCUMENTS

| | | | |
|---|---|---|---|
| 7,026,788 B2 | 4/2006 | Yano et al. | |
| 7,924,019 B2 | 4/2011 | Trenchs Magana et al. | |
| 8,421,404 B2 | 4/2013 | Nakamura et al. | |
| 9,096,139 B2 | 8/2015 | Nakamura et al. | |
| 2015/0108974 A1* | 4/2015 | Kennedy | G01R 33/098 324/252 |
| 2016/0245893 A1* | 8/2016 | Cosgrave | G01R 33/096 |
| 2017/0356949 A1* | 12/2017 | Tomkins | G01R 31/006 |
| 2018/0059148 A1* | 3/2018 | Geisler | G01R 15/20 |
| 2018/0164361 A1* | 6/2018 | Premerlani | G01R 31/52 |
| 2018/0164362 A1* | 6/2018 | Premerlani | G01R 31/007 |
| 2019/0331714 A1* | 10/2019 | Yuan | G01R 15/185 |

* cited by examiner

*Primary Examiner* — Dominic E Hawkins
(74) *Attorney, Agent, or Firm* — Brooks Kushman P.C.

(57) ABSTRACT

An electric current sensor for detecting a leakage current from an electric vehicle charger. The current sensor includes a magnetic core having a gap formed therein, a first conductor wound around the magnetic core to form a first coil, a second conductor wound around the magnetic core to form a second coil, and a tunnel-magnetoresistance (TMR) sensor element arranged in the gap of the magnetic core. A difference between electric current flow in the first and second conductors produces a magnetic field in the gap of the magnetic core proportional to a leakage current, and the magnetic field produces a voltage in the TMR sensor element indicative of a value of the leakage current.

20 Claims, 13 Drawing Sheets

ELECTRIC CURRENT SENSOR FOR DETECTING LEAKAGE CURRENT

TECHNICAL FIELD

The following relates to an electric current sensor for detecting a leakage current from an electric vehicle charger.

BACKGROUND

With the development and acceptance of Electric Vehicle (EV) technology by the major automotive markets in the world, safety requirements for an EV charger, including on-board chargers and wireless chargers, may be met by implementation of the International Electrotechnical Commission (IEC) 62752 standard for In-Cable Control and Protection Devices (IC-CPD) for charging EVs. The IEC 62752 standard requires the detection of a Direct Current (DC) leakage current level of 6 milliamperes and an Alternating Current (AC) leakage current level from 15 to 30 milliamperes.

Currently, the major leakage current sensor detection technologies for EV leakage current detection are fluxgate and magnetic modulation current detection. Both of those technologies need to have an external circuit and magnetic core windings to drive the magnetic core to the expected condition to enable the sensor to detect a leakage current. Normally, magnetic core windings need to have a high number of turns to enable the magnetic core to meet the expected condition. These requirements, however, make the whole sensor detection system more complicated and expensive.

Another potential leakage current detection technology that is currently used in the auto industry is a Hall current sensor. The major drawback for Hall sensor technology is that the detection of magnetic field flux levels should be no less than 100 Gauss (or 10 milliTeslas). This requirement means that a Hall sensor is good only for high current detection. In that regard, the magnetic field flux for a sensor detecting a leakage current level of 6 milliamperes, as required under the IEC 62752 standard, will be at a level of less than 1 Gauss. Such a magnetic field flux level is outside the detection range of a Hall sensor.

A need therefore exists for an improved electric current sensor for detecting a leakage current from an electric vehicle charger. Such an improved leakage current sensor would detect lower leakage current levels with lower cost.

SUMMARY

According to one non-limiting exemplary embodiment described herein, an electric current sensor is disclosed for detecting a leakage current from an electric vehicle charger. The current sensor comprises a magnetic core having a gap formed therein, a first conductor wound around the magnetic core to form a first coil, a second conductor wound around the magnetic core to form a second coil, and a tunnel-magnetoresistance (TMR) sensor element arranged in the gap of the magnetic core. A difference between electric current flow in the first and second conductors produces a magnetic field in the gap of the magnetic core proportional to a leakage current, and the magnetic field produces a voltage in the TMR sensor element indicative of a value of the leakage current.

According to another non-limiting exemplary embodiment described herein, an electric current sensor is disclosed for detecting a leakage current from an electric vehicle charger. The current sensor comprises a magnetic core having a gap formed therein, the magnetic core having a permeability of at least 800 Henries per meter, a first conductor wound around the magnetic core to form a first coil, a second conductor wound around the magnetic core to form a second coil, and a tunnel-magnetoresistance (TMR) sensor element arranged in the gap of the magnetic core. The current sensor further comprises a signal conditional circuit provided in electrical communication with the TMR sensor element, and a housing for the signal conditional circuit, the TMR sensor element, and at least a portion of the magnetic core having the gap formed therein. A difference between electric current flow in the first and second conductors produces a magnetic field in the gap of the magnetic core proportional to a leakage current, the magnetic field produces a voltage in the TMR sensor element indicative of a value of the leakage current, and the voltage in the TMR sensor element is measurable at electrically conductive leads for the signal conditional circuit extending from the housing.

A detailed description of these and other non-limiting exemplary embodiments of an electric current sensor for detecting a leakage current from an electric vehicle charger is set forth below together with accompanying drawings.

DETAILED DESCRIPTION

As required, detailed non-limiting embodiments are disclosed herein. However, it is to be understood that the disclosed embodiments are merely exemplary and may take various and alternative forms. The figures are not necessarily to scale, and features may be exaggerated or minimized to show details of particular components, elements, features, items, members, parts, portions, or the like. Therefore, specific structural and functional details disclosed herein are not to be interpreted as limiting, but merely as a representative basis for teaching one skilled in the art.

With reference to the Figures, a more detailed description of non-limiting exemplary embodiments of an electric current sensor for detecting a leakage current from an electric vehicle charger will be provided. For ease of illustration and to facilitate understanding only, like reference numerals may be used herein for like components and features throughout the drawings.

As previously noted, a need exists for an improved electric current sensor for detecting a leakage current from an electric vehicle charger. Such an improved leakage current sensor would detect lower leakage current levels with lower cost.

In that regard, considering cost as well as the leakage current levels to be detected and the magnetic field flux levels involved, as described herein, the present disclosure provides such an improved leakage current sensor. In general, the leakage current sensor of the present disclosure may comprise a toroid shaped core with very high permeability material and specific diameter dimension. The leakage current sensor of the present disclosure may also comprise a very high sensitivity tunnel-magnetoresistance (TMR) magnetic sensor arranged in a gap provided in such a toroid core. By adding winding turns on the toroid core for input and neutral lines, the leakage current sensor of the present disclosure can detect AC and DC leakage currents of up to 30 milliamperes with lower cost.

Figure 1A:
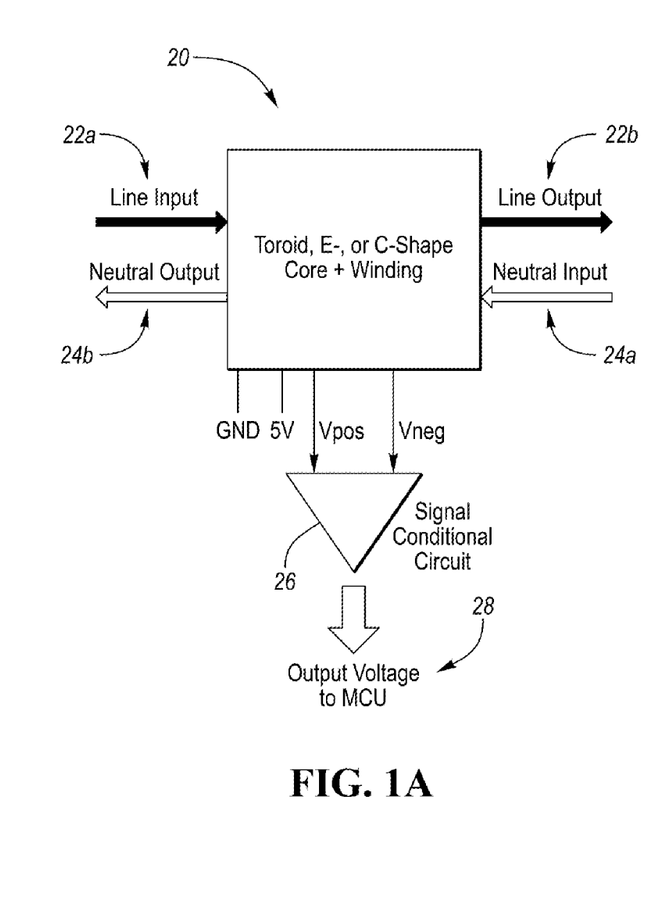
FIGS. 1A and 1B are simplified electrical schematics of exemplary embodiments of an electric current sensor for detecting a leakage current from an electric vehicle charger according to the present disclosure.
Figure 1B:
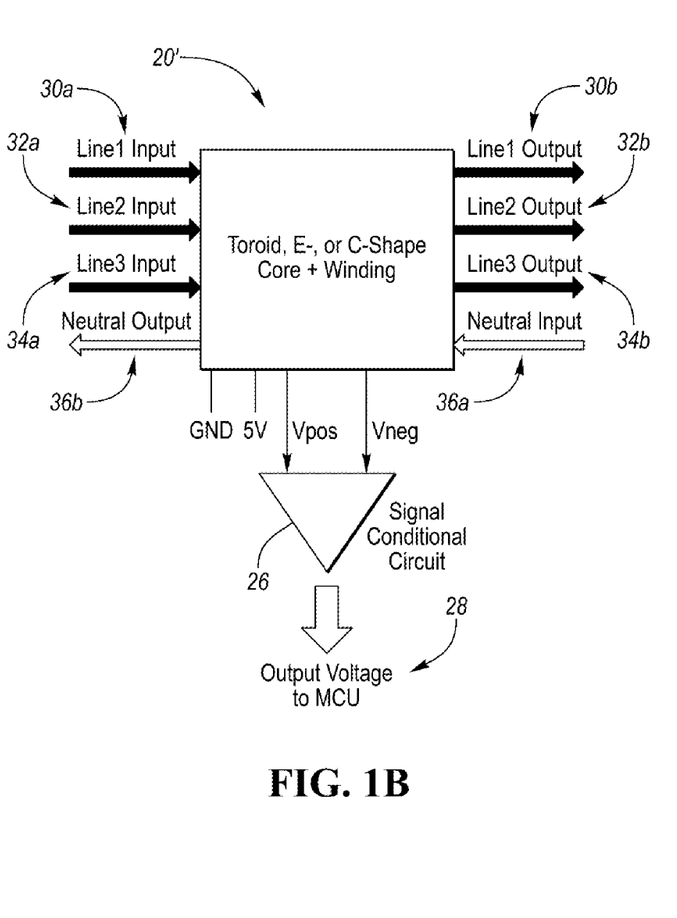

Referring now to FIGS. 1A and 1B, simplified electrical schematics are shown of exemplary embodiments of an electric current sensor for detecting a leakage current from an electric vehicle charger according to the present disclosure. More specifically, FIG. 1A shows an electric current sensor 20 for a single-phase application. The sensor 20 may comprise a magnetic core, which may be toroid shaped, E-shaped, or C-shaped. The sensor 20 may also comprise a winding of electrical conductors in the form of wires, such as solid magnetic wires, polypropylene ethylene (PPE) coated wires, thermoplastic elastomer (TPE) coated wires, or polyvinyl chloride (PVC) coated wires, which may have various numbers of turns (not shown). The wires may comprise a line input 22a and a line output 22b, as well as a neutral input 24a and a neutral output 24b. In that regard, the line input/output 22a, 22b and neutral input/output 24a, 24b may be configured to carry or conduct a DC current or a single-phase AC current.

The sensor 20 may also comprise a TMR element which may be arranged in a gap formed in the magnetic core (not shown). The sensor 20 may output a differential voltage $V_{positive}$ and $V_{negative}$ based on the current in the line input/output 22a, 22b in comparison to the current in the neutral input/output 24a, 24b. The differential voltage ($V_{pos}$, $V_{neg}$) may be communicated to a signal conditional circuit 26, which may be configured to produce a differential output voltage signal 28 which may be communicated to a microcontroller unit (MCU).

FIG. 1B shows an electric current sensor 20' for a three-phase application. As seen therein, the sensor 20' may again comprise a magnetic core, which may be toroid shaped, E-shaped, or C-shaped. The sensor 20' may also again comprise a winding of electrical conductors in the form of wires, such as such as solid magnetic wires, PPE coated wires, TPE coated wires, or PVC coated wires, which may have various numbers of turns. The wires may comprise line 1 input 30a, line 2 input 32a, and line 3 input 34a, as well as line 1 output 30b, line 2 output 32b, and line 3 output 34b. The wires may also comprise a neutral input 36a and a neutral output 36b. In that regard, the line 1 input/output 30a, 30b, the line 2 input/output 32a, 32b, the line 3 input/output 34a, 34b, and the neutral input/output 36a, 35b may be configured to carry or conduct a DC current or three-phase AC current.

The sensor 20' may also comprise a TMR element which may be arranged in a gap formed in the magnetic core (not shown). The sensor 20' may output a differential voltage $V_{positive}$ and $V_{negative}$ based on the current in the line 1 input/output 30a, 30b in comparison to the current in the neutral input/output 36a, 36b, or based on the current in the line 2 input/output 32a, 32b in comparison to the current in the neutral input/output 36a, 36b, or based on the current in the line 3 input/output 34a, 34b in comparison to the current in the neutral input/output 36a, 36b. The differential voltage ($V_{pos}$, $V_{neg}$) may be communicated to a signal conditional circuit 26, which may be configured to produce a differential output voltage signal 28 which may be communicated to a microcontroller unit (MCU).

Figure 2:
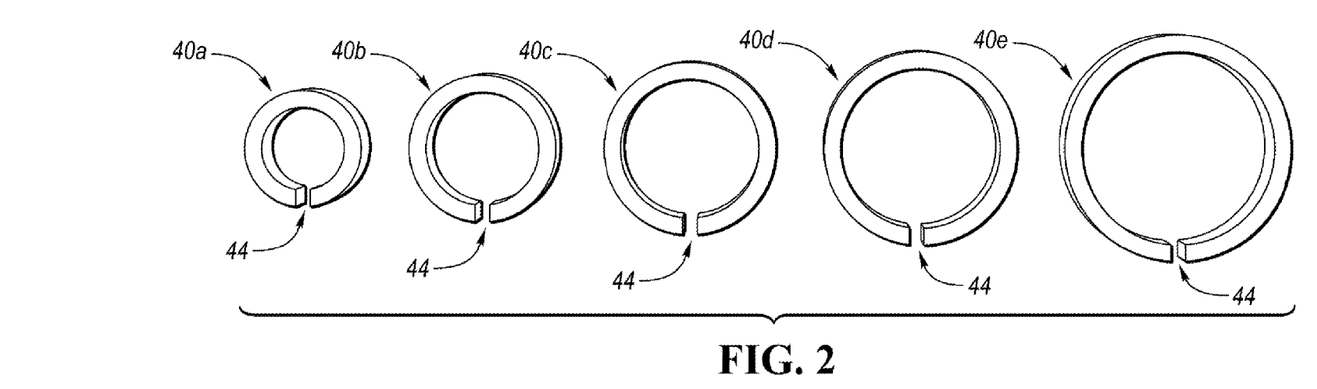
FIG. 2 depicts side views of exemplary toroidal cores for use in exemplary embodiments of an electric current sensor for detecting a leakage current from an electric vehicle charger according to the present disclosure.

Referring next to FIG. 2, side views are shown of exemplary toroidal cores 40a, 40b, 40c, 40d, 40e for use in exemplary embodiments of an electric current sensor for detecting a leakage current from an electric vehicle charger according to the present disclosure. In that regard, the exemplary toroidal cores 40a, 40b, 40c, 40d, 40e depicted may have outside diameters (OD) of 15, 20, 25, 30, and 35 millimeters, respectively. It should be noted, however, the toroidal cores for use in exemplary embodiments of an electric current sensor for detecting a leakage current from an electric vehicle charger according to the present disclosure may be provided with ODs of 10 to 50 millimeters, and preferably 25 to 40 millimeters. It should also be noted that the toroidal cores are magnetic, may comprise a nanocrystalline, silicon steel or ferrite material, and may have a permeability of 800 to 50,000 Henries per meter, and preferably 3200 to 10,000 Henries per meter. Moreover, as seen in FIG. 2, each of the exemplary toroidal cores 40a, 40b, 40c, 40d, 40e may have a gap 44 formed therein, which may have a width of 3.0 (+/−0.5) millimeters, and preferably 3.0 millimeters.

Figure 3:
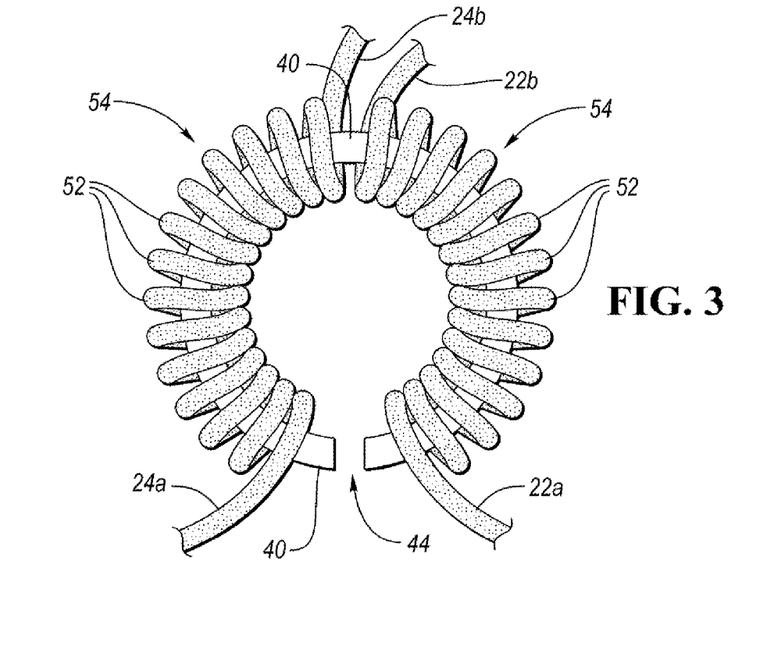
FIG. 3 is a side view of an exemplary toroidal core and windings for use in an exemplary embodiment of an electric current sensor for detecting a leakage current from an electric vehicle charger according to the present disclosure.

FIG. 3 is a side view of an exemplary toroidal core 40 and windings 52 forming coils 54 for use in an exemplary embodiment of an electric current sensor 20 for detecting a leakage current from an electric vehicle charger according to the present disclosure. In that regard, the toroidal core 40 shown has an OD of 25 millimeters and the coils 54 comprise multiple turns of PPE coated wires, TPE coated wires, or PVC coated wires configured as a line input 22a and a line output 22b, as well as a neutral input 24a and a neutral output 24b. As seen therein, the toroidal core 40 may have a gap 44 formed therein, and a TMR sensor element (not shown) may be arranged in the gap 44. Once again, the gap 44 may have a width of 3.0 (+/−0.5) millimeters, and preferably 3.0 millimeters. It should also be noted that the windings 52 and/or coils 54 may have or be provided with up to fifty (50) turns of the PPE, TPE, or PVC coated wires.

Still referring to FIG. 3, and with continuing reference to FIGS. 1A and 1B, line input/output 22a, 22b may carry an AC current used for charging EV batteries (not shown), and neutral input/output 24a, 24b may carry an AC return current after charging the EV batteries. A difference or imbalance between the current carried by the line input/output 22a, 22b and the neutral input/output 24a, 24b may be attributed to an AC or DC leakage current. Any such difference or imbalance between the current carried by the line input/output 22a, 22b and the neutral input/output 24a, 24b creates a magnetic field in the gap 44 of the core 40, which magnetic field reflects, indicates, or is representative of an AC or DC leakage current. As seen in FIG. 3, each of the line input/output 22a, 22b and the neutral input/output 24a, 24b may comprise PPE coated wires, TPE coated wires, or PVC coated wires. Alternatively, each of the line input/output 22a, 22b and the neutral input/output 24a, 24b may comprise solid magnetic wires.

Figure 4A:
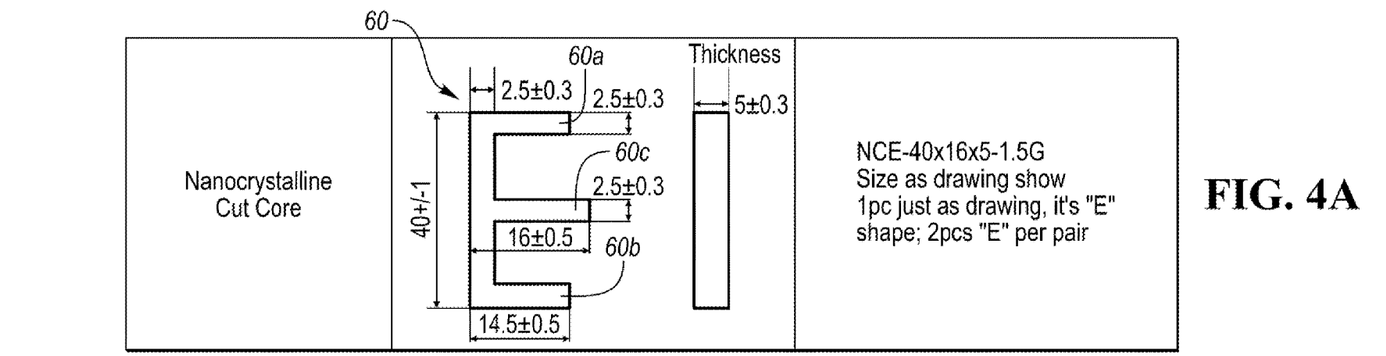
FIGS. 4A-4C are side views of exemplary alternative cores for use in an exemplary embodiment of an electric current sensor for detecting a leakage current from an electric vehicle charger according to the present disclosure.
Figure 4B:
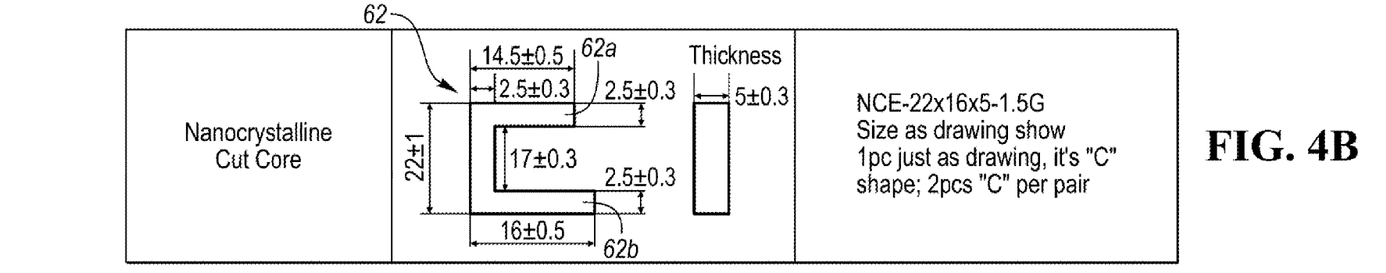
Figure 4C:
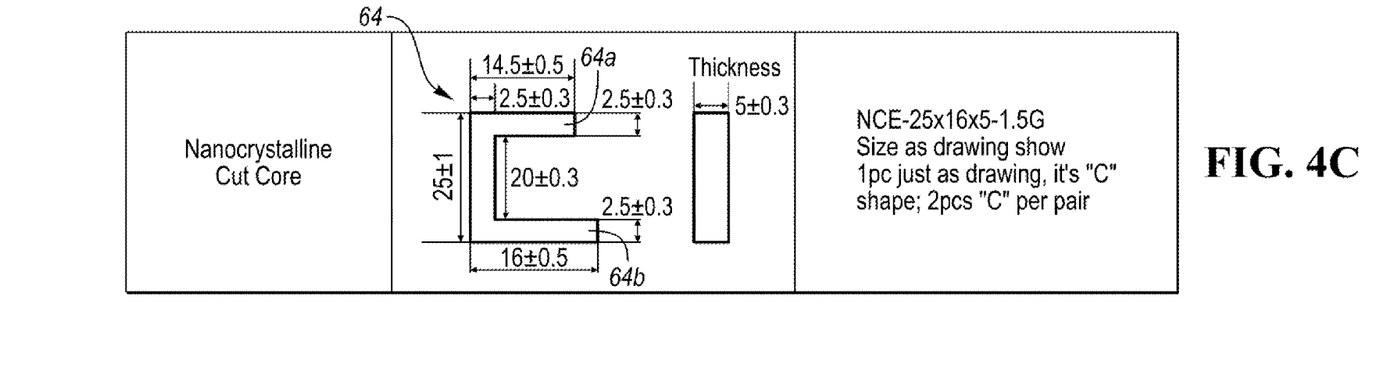

Referring next to FIGS. 4A-4C, side views are shown of exemplary alternative cores for use in an exemplary embodiment of an electric current sensor for detecting a leakage current from an electric vehicle charger according to the present disclosure. More specifically, FIG. 4A depicts an E-shaped nanocrystalline cut magnetic core 60 (e.g., silicon steel or ferrite). The core 60 may be provided with a height of 40 (+/−1) millimeters, a width of 16 (+/−0.5) millimeters, and a thickness of 5 (+/−0.3) millimeters. The top and bottom (or outermost) legs 60a, 60b of the core 60 may be provided with a width of 14.5 (+/−0.5) millimeters. Moreover, each of the legs 60a, 60b, 60c of the core 60 may be provided with a height of 2.5 (+/−0.3) millimeters. The core 60 may also have a magnetic induction of 1.5 Gauss.

FIGS. 4B and 4C depict C-shaped nanocrystalline cut magnetic cores 62 and 64. As seen in FIG. 4B, the core 64 may be provided with a height of 22 (+/−1) millimeters, a width of 16 (+/−0.5) millimeters, and a thickness of 5 (+/−0.3) millimeters. The top leg 62a of the core 62 may be provided with a width of 14.5 (+/−0.5) millimeters. Moreover, each of the legs 62a, 62b of the core 62 may be provided with a height of 2.5 (+/−0.3) millimeters, and a distance of 17 (+/−0.3) millimeters may be provided therebetween. As seen in FIG. 4C, the core 64 may be provided with a height of 25 (+/−1) millimeters, a width of 16 (+/−0.5) millimeters, and a thickness of 5 (+/−0.3) millimeters. The top leg 64a of the core 64 may be provided with a width of 14.5 (+/−0.5) millimeters. Each of the legs 64a, 64b of the core 64 may also be provided with a height of 2.5 (+/−0.3) millimeters, and a distance of 20 (+/−0.3) millimeters may be provided therebetween. Each of the cores 62 and 64 may also have a magnetic induction of 1.5 Gauss.

Referring now to FIGS. 5A-5D, exploded, bottom, and perspective views are shown of an exemplary embodiment of an electric current sensor 20 for detecting a leakage current from an electric vehicle charger according to the present disclosure. As seen therein, the sensor 20 may comprise a magnetic toroidal core 40 having a gap 44 formed therein. The sensor may further comprise a TMR sensor element 58 and a signal conditional circuit 26, each of which may be mounted on a printed circuit board (PCB) 70 and provided in electrical communication with each other.

The sensor 20 may also comprise a housing 72, which may comprise a base 74 and a cover 76 (shown in phantom). The housing 72 may be configured to house the PCB 70, including the TMR sensor element 58 and the signal conditional circuit 26 mounted thereon, as well as at least a portion of the core 40 having the gap 44 formed therein. The housing 72, including the base 74 and the cover 76, may also comprise a material suitable to provide magnetic shielding to or for the TMR sensor element 58.

Still referring to FIGS. 5A-5D, the sensor 20 may further comprise coil leads 80, including line input lead 82a, line output lead 82b, neutral input lead 84a, and neutral output lead 84b, which may be mounted in and extend through the housing 72. As previously described in connection with FIG. 3, line input/output 22a, 22b and neutral input/output 24a, 24b may be wound around core 40. In that regard, line input 22a may be connected to a first end of line input lead 82a, and line output 22b may be connected to a first end of line output lead 82b. Similarly, neutral input 24a may be connected to a first end of neutral input lead 84a, and neutral output 24b may be connected to a first end of neutral output lead 84b. Each of the second ends of the line input lead 82a, the line output lead 82b, the neutral input lead 84a, and the neutral output lead 84b may be connected to line input, line output, neutral input, and neutral output conductors from the EV, respectively (not shown).

The electric current sensor 20 for detecting a leakage current from an electric vehicle charger as described herein thus may comprise a magnetic core 40 having a gap 44 formed therein, a first conductor 22a, 22b wound around the magnetic core 40 to form a first coil, a second conductor 24a, 24b wound around the magnetic core 40 to form a second coil, and a TMR sensor element 58 arranged in the gap 44 of the magnetic core 40. A difference between electric current flow in the first 22a, 22b conductor and the second conductor 24a, 24b produces a magnetic field in the gap 44 of the magnetic core 40 proportional to a leakage current, and the magnetic field produces a voltage in the TMR sensor element 58 reflecting, representing, or indicative of a value of the leakage current. The leakage current detected may be a direct current (DC) or an alternating current (AC) having a value of up to 30 milliamperes.

Figure 5A:
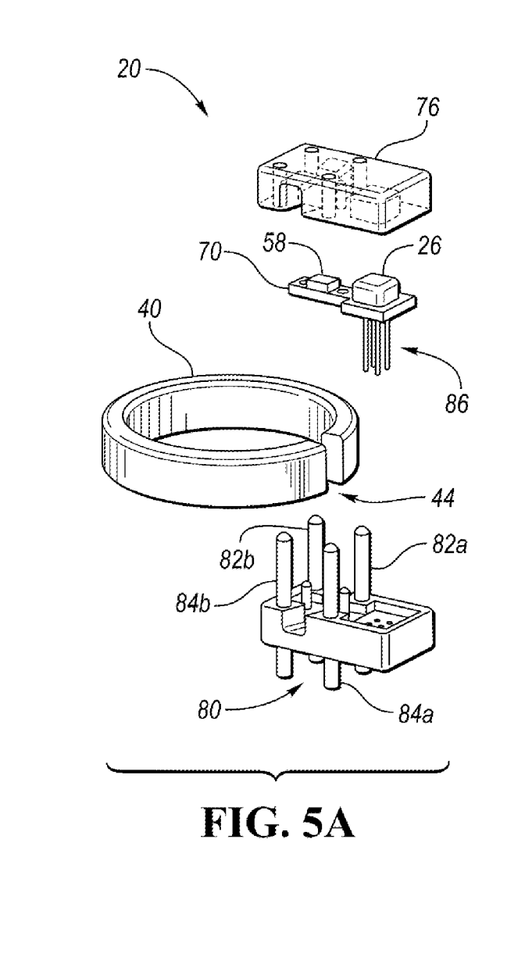
FIGS. 5A-5D are different views of an exemplary embodiment of an electric current sensor for detecting a leakage current from an electric vehicle charger according to the present disclosure.
Figures 5B, 5C, 5D:
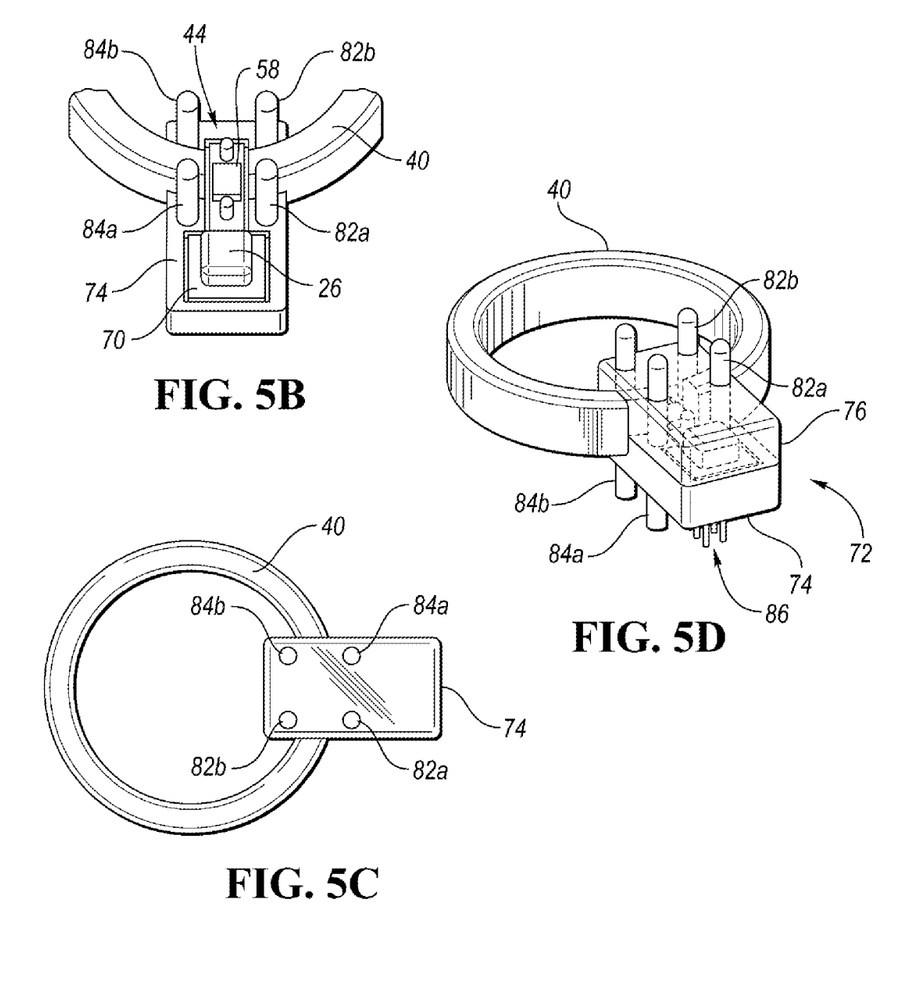

The signal conditional circuit 26 may also be provided with conductive leads 86. The conducting leads 86 may be configured to provide power to the signal conditional circuit 26 and to communicate output signals from the signal conditional circuit 26 reflecting, indicating, or representing the value of a leakage current detected by the current sensor 20. As best seen in FIGS. 5A and 5D, the conductive leads 86 of the signal conditional circuit 86 may be configured to extend through the PCB 70 and the base 74 of the housing 72. In that regard, based on the voltage produced in the TMR sensor element 58 by the magnetic field created in the gap 44 of the core 40 by the difference between current flow in the first 22a, 22b conductor and the second conductor 24a, 24b, the signal conditional circuit 26 may generate a differential output voltage signal 28 reflecting, indicating, or representing the value of the leakage current. In turn, the differential output voltage signal 28 is measurable at conductive leads 86 for the signal conditional circuit 26 extending from the base 74 of the housing 72.

Referring now to FIGS. 6-9, parameter graphs are shown of exemplary embodiments of an electric current sensor for detecting a leakage current from an electric vehicle charger according to the present disclosure. In that regard, it should be noted that the magnetic core 40 shown and described in connection with FIGS. 2, 3, and 5A-5D should be large enough to permit winding of the solid magnetic wires, PPE coated wires, TPE coated wires, or PVC coated wires around the core 40, but small enough to prevent the magnetic fields (produced by a current differential or imbalance due to a leakage current) from falling to levels that are not measurable or detectable.

Figure 6:
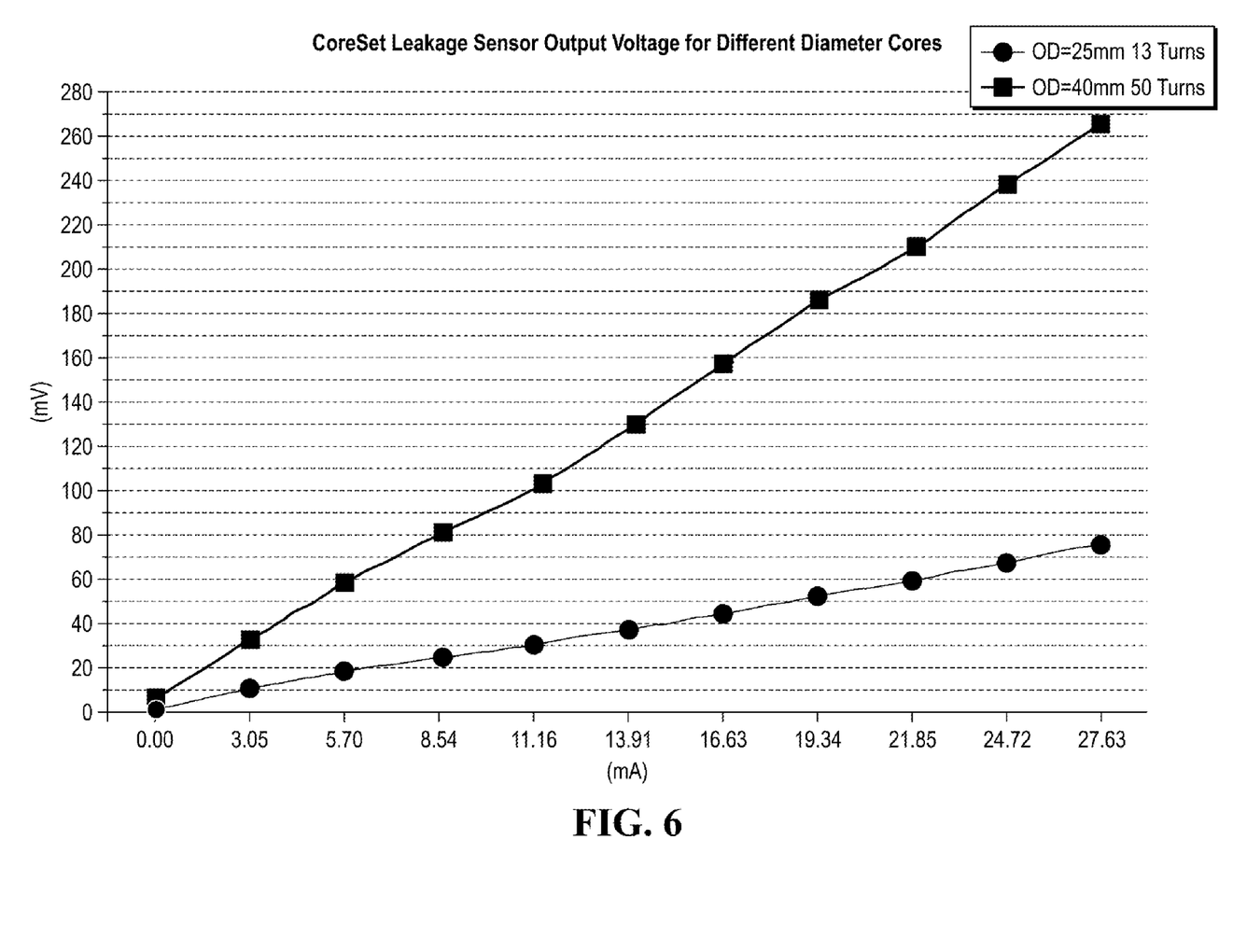
FIGS. 6-9 are parameter graphs of exemplary embodiments of an electric current sensor for detecting a leakage current from an electric vehicle charger according to the present disclosure.

In that regard, FIG. 6 illustrates leakage current sensor output voltages for different diameter toroid cores, specifically a core having an OD of 25 millimeters (lower curve) and a core having an OD of 40 millimeters (upper curve). As seen therein, for a leakage current of approximately 6 milliamperes DC, a sensor core OD of 25 mm has a leakage sensor output voltage of approximately 19 millivolts, and a sensor core OD of 40 mm has a leakage sensor output voltage of approximately 59 millivolts. That is, for a leakage current of approximately 6 milliamperes DC, potential sensor core diameters of 25 to 40 mm have an expected leakage sensor output voltage in the range of 19 to 59 millivolts. Such output voltage levels are sufficiently high to be detectable by an operational amplifier (OP AMP) signal conditional circuit.

Figure 7:
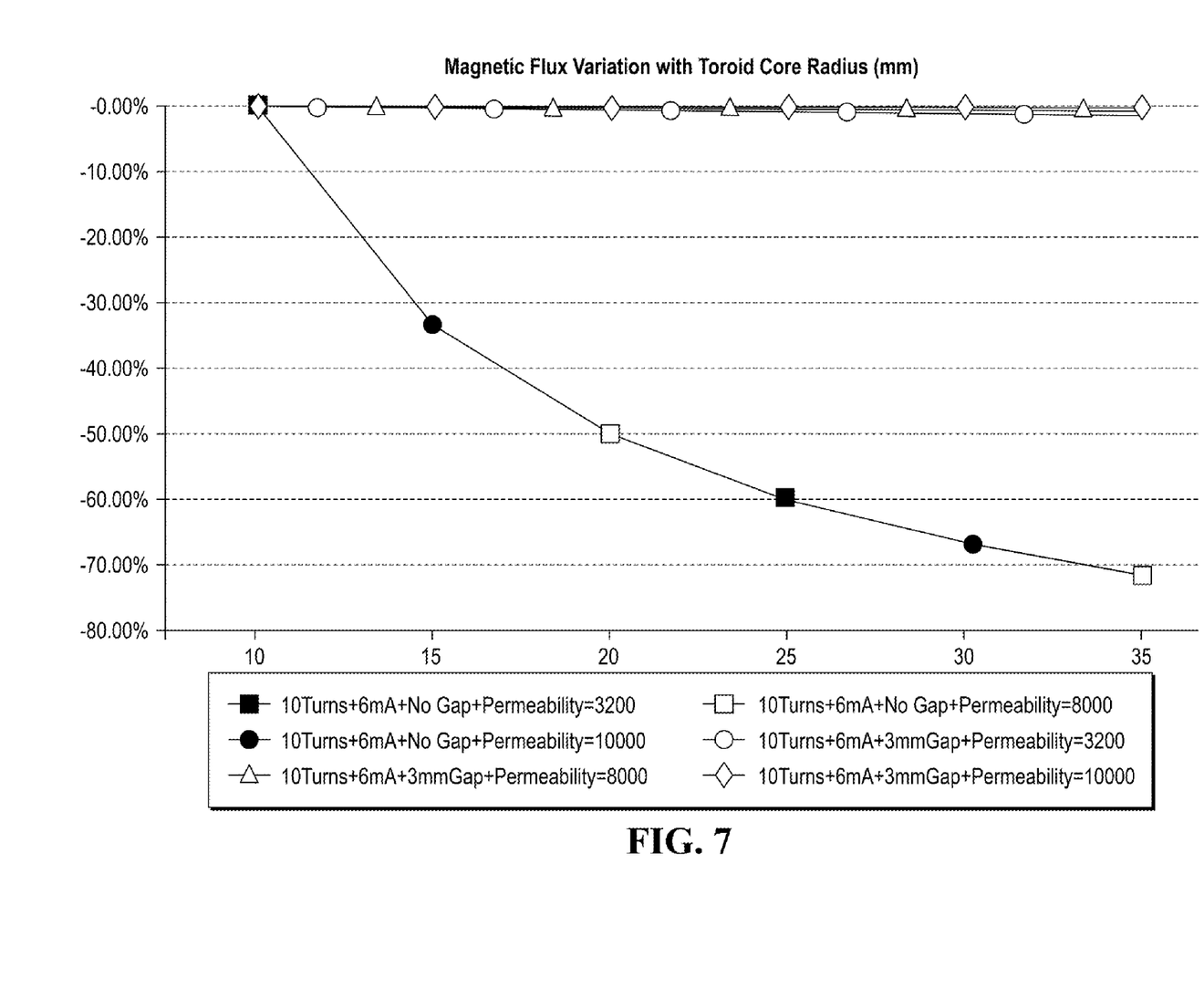

Theoretically, a toroid core is also the best shape to boost the magnetic field. FIG. 7 illustrates magnetic flux variation in toroidal cores as a function of core radius. In that regard, three pairs of toroid core configurations are charted. For each pair, one core has no gap and the other core has a gap of 3 millimeters. Other characteristics are the same for both cores in each pair, such as the number of coil turns (i.e., 10) and permeability (e.g., 3200, 8000, 10000 Henries/meter). As seen therein, the value of the magnetic field flux level drops very quickly as core radius is increased from 10 to 35 millimeters for all cores having no gap. However, for all gapped toroid cores, this performance changes and magnetic flux variation is relatively stable as core radius in increased from 10 to 35 millimeters. In particular, for a 3 mm gap in the toroid cores, the magnetic flux inside the core will only be reduced (i) 1.6% when permeability is 3200 Henries/meter and core radius changes from 10 to 35 mm; (ii) 0.65% when permeability equals 8000 Henries/meter and core radius changes from 10 to 35 mm; and (iii) 0.52% when permeability is 10,000 Henries/meter and core radius changes from 10 to 35 mm. These results enable magnetic field flux inside a gapped toroid core to be unchanged or kept constant by increasing the toroid core diameter.

Figure 8:
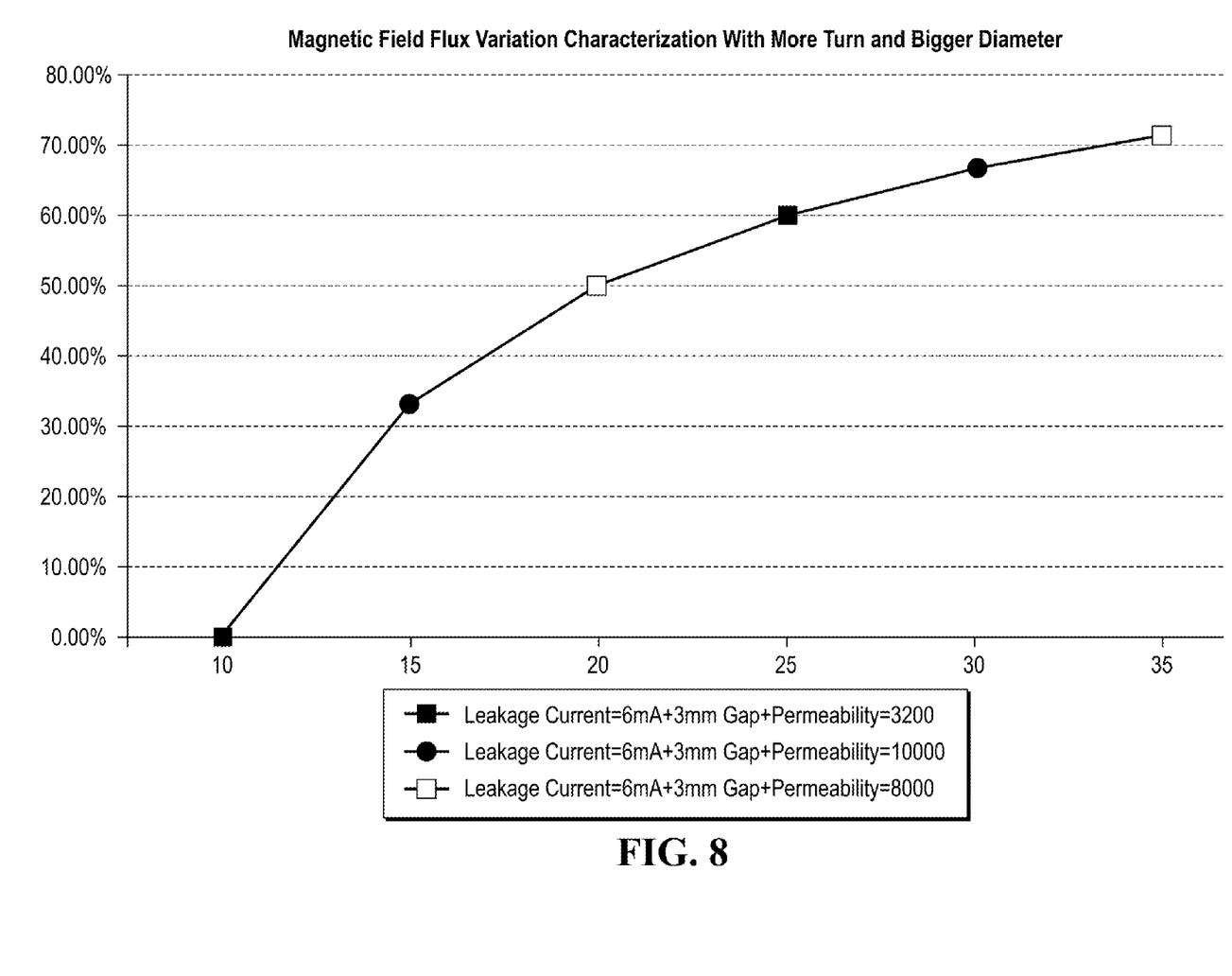

Toroid core diameter can also be increased to boost magnetic field flux inside the toroid core. Such an effect allows for high power single-phase and three-phase leakage sensor design. In that regard, FIG. 8 illustrates magnetic field flux variation with an increased number of turns in a coil and larger diameter toroid cores. As seen therein, for toroid cores having a gap of 3 millimeters formed therein, magnetic field flux variation increases significantly as core OD is increased from 10 to 35 millimeters. Such increases are similar for toroid cores having permeabilities of 3200, 8000, and 10000 Henries/meter.

Figure 9:
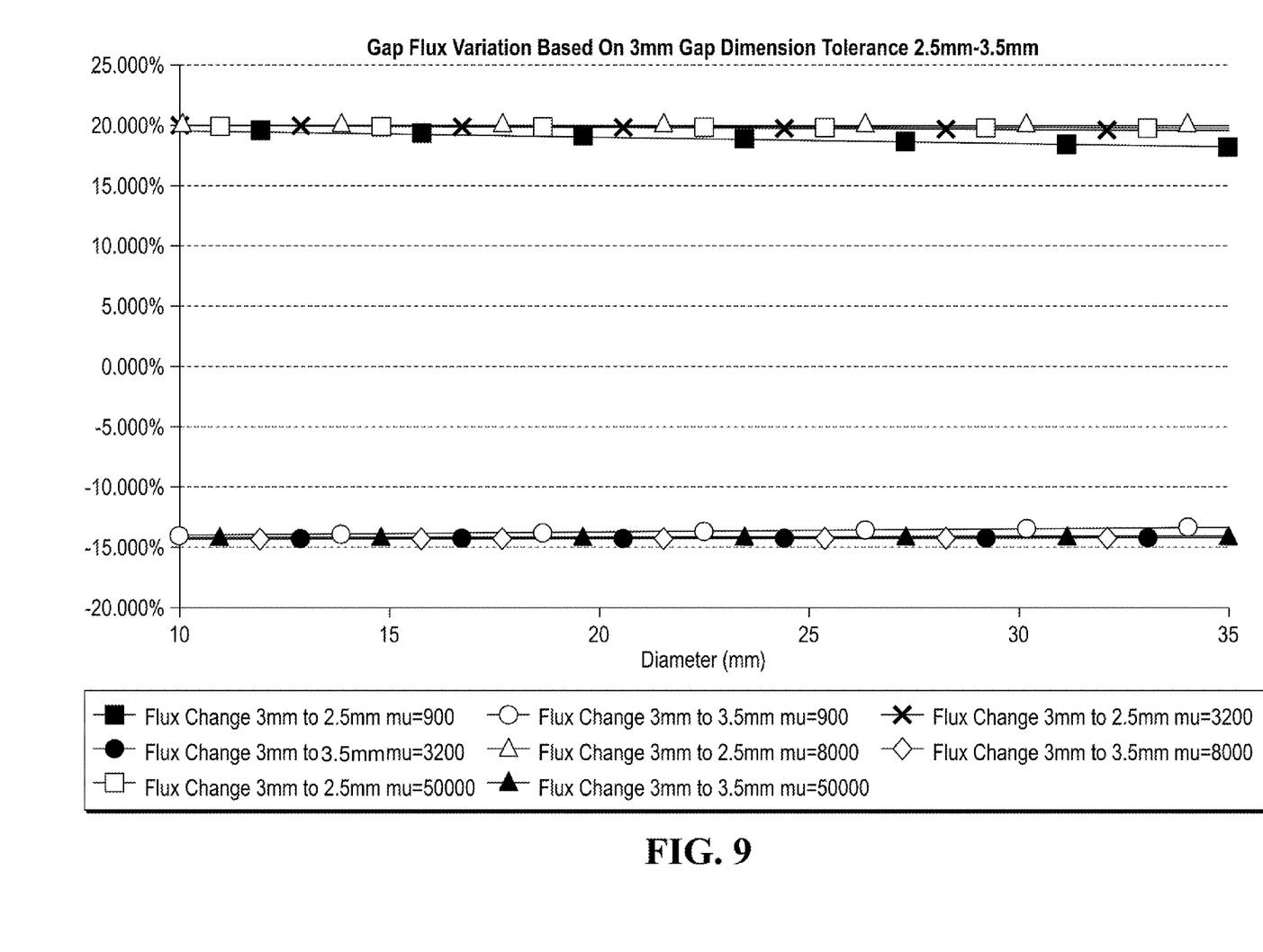

FIG. 9 illustrates gap magnetic flux variations for toroid cores having gaps of 3 millimeters formed therein with tolerances of 2.5 to 3.5 millimeters. As seen therein, for toroid cores having permeabilities of 900, 3200, 8000, and 50000 Henries/meter and gaps of 2.5 to 3.0 millimeters, gap magnetic flux variations remain relatively unchanged between approximately 18% and 20% as core OD is increased from 10 to 35 millimeters. Similarly, for toroid cores having permeabilities of 900, 3200, 8000, and 50000 Henries/meter and gaps of 3.0 to 3.5 millimeters, gap magnetic flux variations remain relatively unchanged between approximately −13% and −14% as core OD is increased from 10 to 35 millimeters.

Figure 10A:
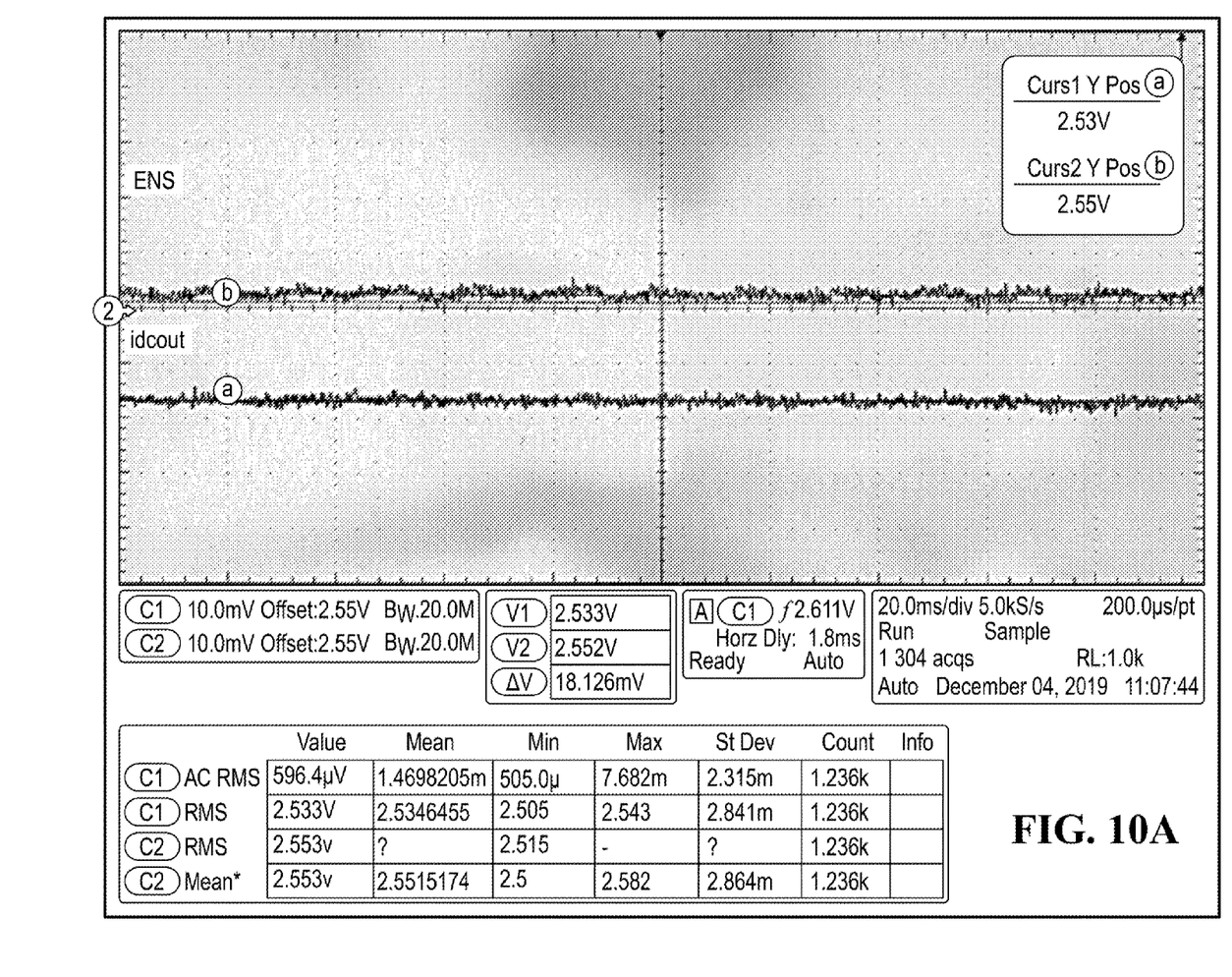
FIGS. 10A and 10B are voltage measurements for exemplary embodiments of an electric current sensor for detecting a leakage current from an electric vehicle charger according to the present disclosure.
Figure 10B:
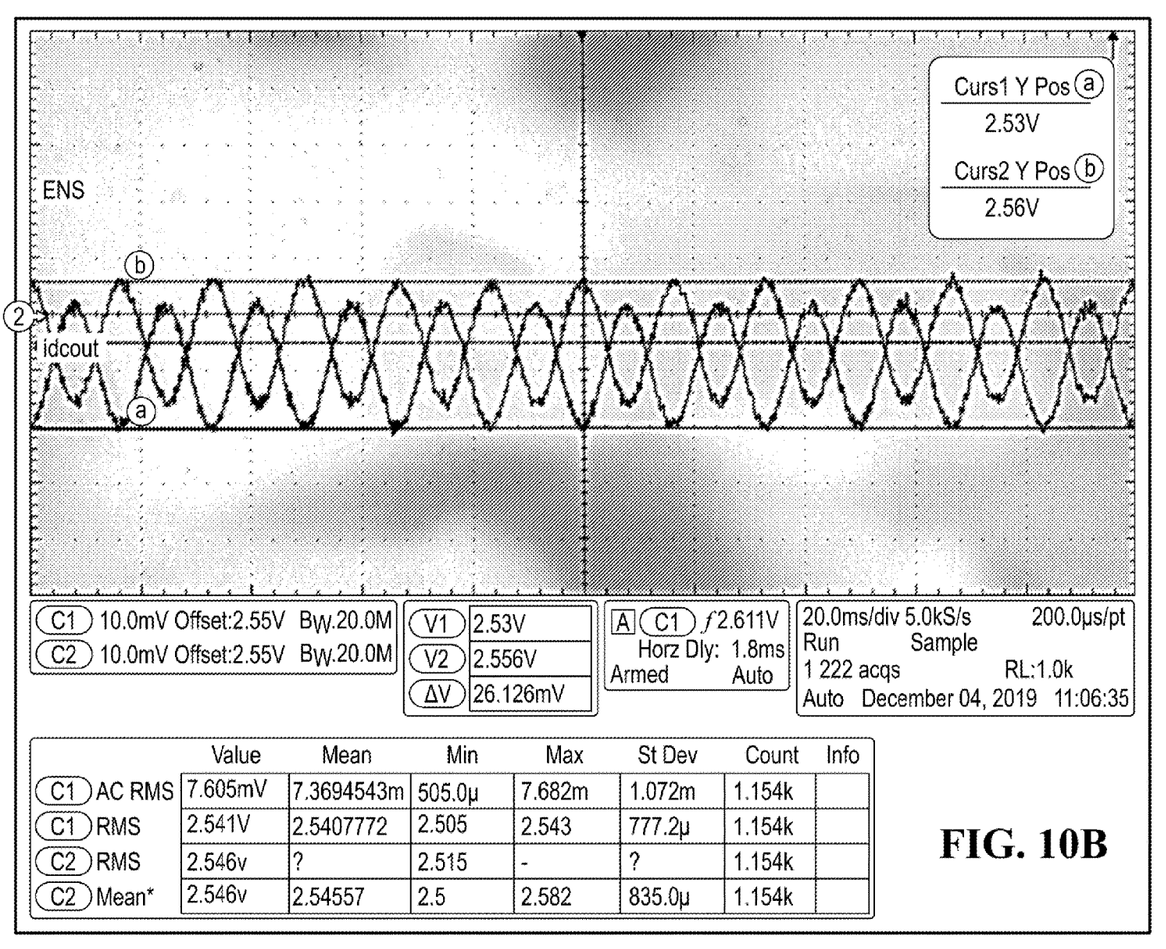

Referring next to FIGS. 10A and 10B, voltage measurements are shown for exemplary embodiments of an electric current sensor for detecting a leakage current from an electric vehicle charger according to the present disclosure. More specifically, FIG. 10A shows leakage sensor output voltage curves for a DC leakage current of 5.9 milliamperes detected with a sensor having a toroid core with an OD of 25 millimeters. FIG. 10B shows leakage sensor output voltage curves for an AC leakage current of 10 milliamperes (at 50 Hertz) detected with a sensor having a toroid core with an OD of 25 millimeters.

Figure 11:
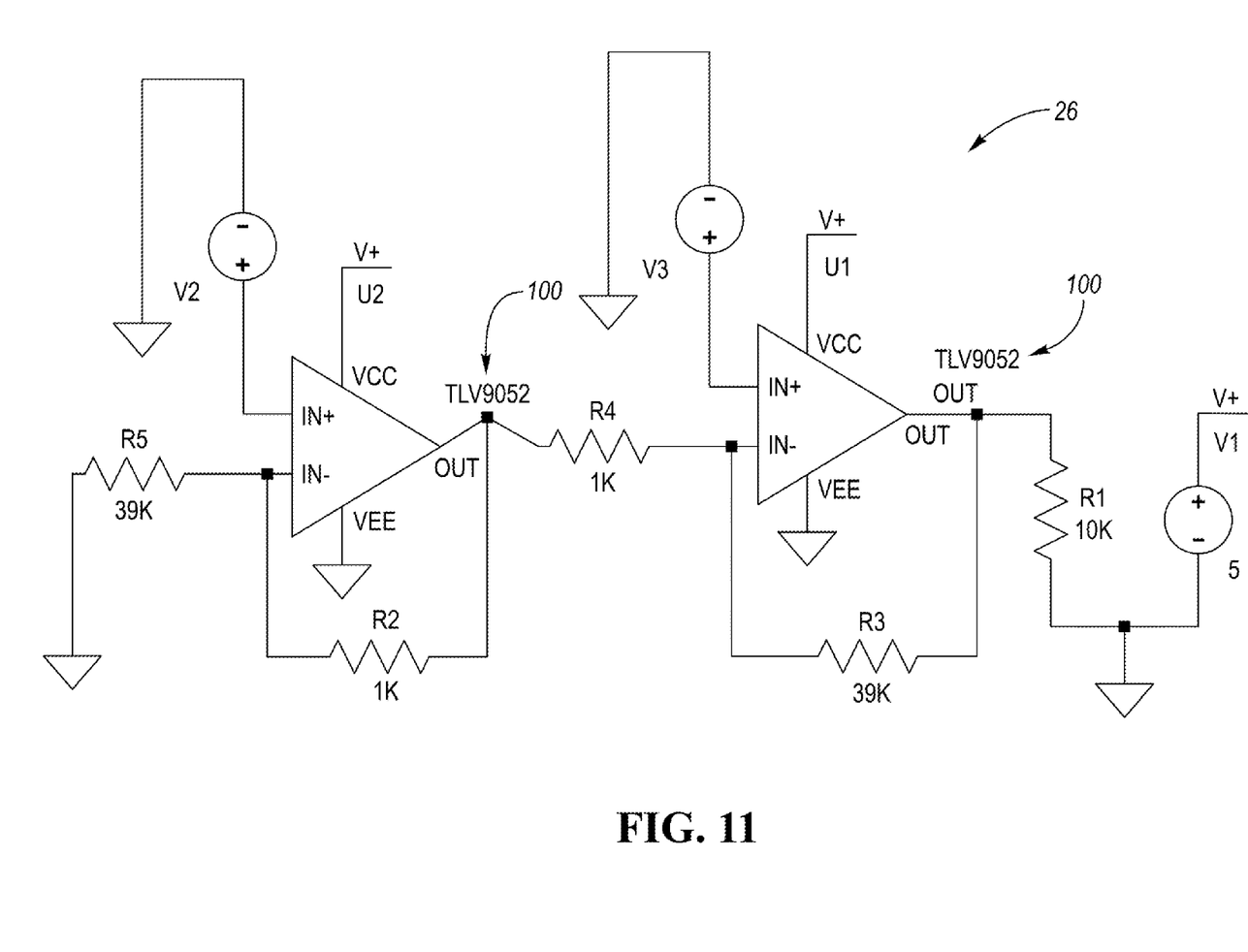
FIG. 11 is a simplified schematic of a signal conditional circuit for use with exemplary embodiments of an electric current sensor for detecting a leakage current from an electric vehicle charger according to the present disclosure.

FIG. 11 is a simplified schematic of a signal conditional circuit 26 for use with exemplary embodiments of an electric current sensor 20 for detecting a leakage current from an electric vehicle charger according to the present disclosure. FIGS. 12A, 12B, 13A, and 13B are voltage measurements and signal conditional circuit outputs for exemplary embodiments of an electric current sensor 20 for detecting a leakage current from an electric vehicle charger according to the present disclosure.

Figure 12A:
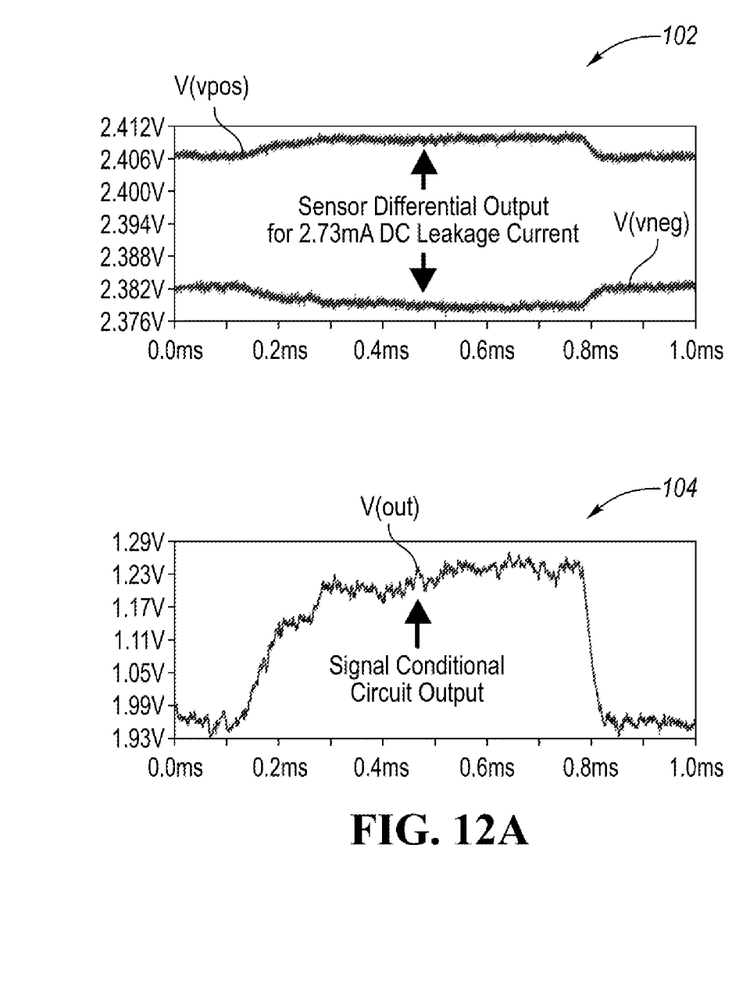
FIGS. 12A and 12B are voltage measurements and signal conditional circuit outputs for exemplary embodiments of an electric current sensor for detecting a leakage current from an electric vehicle charger according to the present disclosure.
Figure 12B:
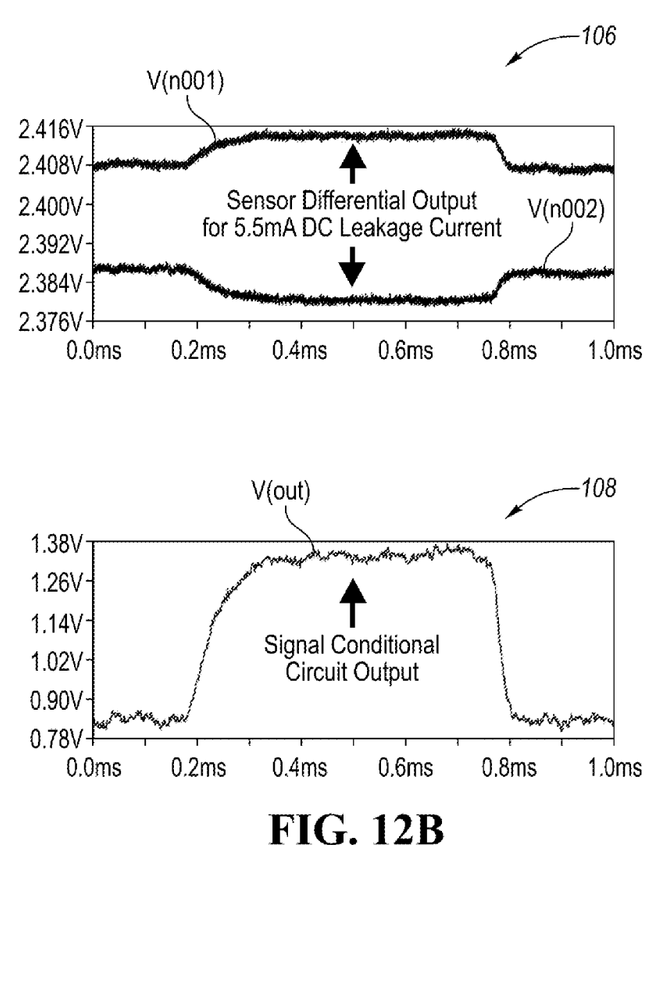

In that regard, the signal conditional circuit 26 shown in FIG. 11 may comprise a TLV9052 rail-to-rail input and output dual operational amplifier manufactured by Texas Instruments. A leakage current in an EV charger of 2.73 milliamperes DC may result in sensor 20 producing a differential output 102 shown in FIG. 12A. Using operational amplifiers 100, the signal conditional circuit 26 of FIG. 11 may be configured to produce an output 104 shown in FIG. 12A reflecting, representing, or indicative of that DC leakage current of 2.73 milliamperes. Similarly, a leakage current in an EV charger of 5.5 milliamperes DC may result in sensor 20 producing differential output 106 as shown in FIG. 12B. Using operational amplifiers 100, the signal conditional circuit 26 of FIG. 11 may be configured to produce an output 108 shown in FIG. 12B reflecting, representing, or indicative of that DC leakage current of 5.5 milliamperes. In that regard, the differential outputs 102, 106 may reflect, represent, or be indicative of a difference or imbalance between the current carried by line input/output 22a, 22b and by neutral input/output 24a, 24b, which difference or imbalance may result from a DC leakage current. (See, FIG. 1A.) Once again, any such difference or imbalance between the current carried by the line input/output 22a, 22b and the neutral input/output 24a, 24b creates a magnetic field in the gap 44 of the core 40, which magnetic field reflects, indicates, or is representative of an DC leakage current. (See, FIGS. 1A, 3.)

Figure 13A:
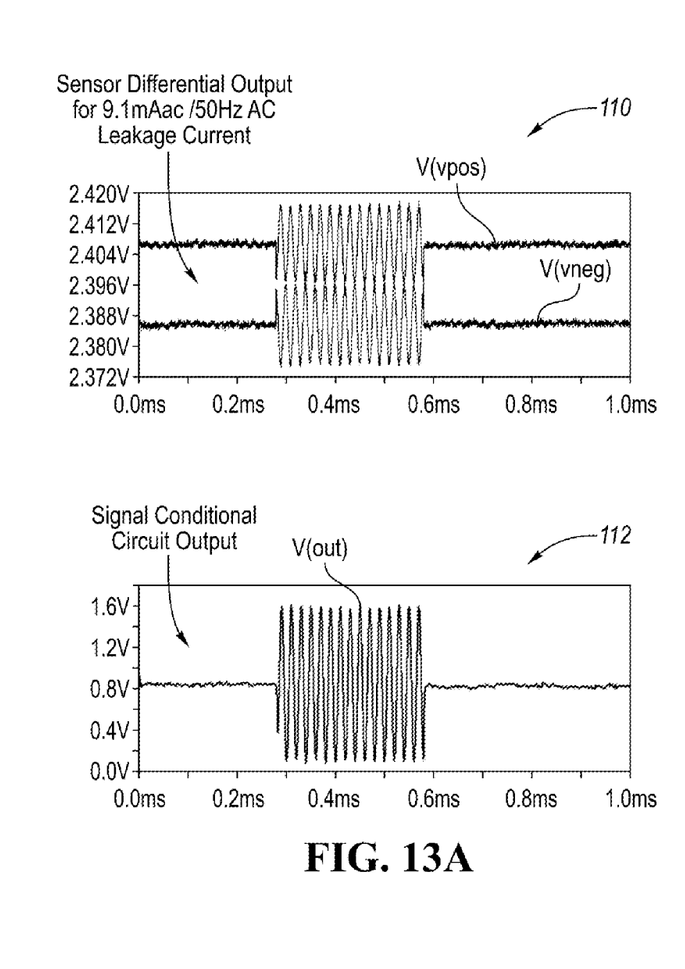
FIGS. 13A and 13B are voltage measurements and signal conditional circuit outputs for exemplary embodiments of an electric current sensor for detecting a leakage current from an electric vehicle charger according to the present disclosure.
Figure 13B:
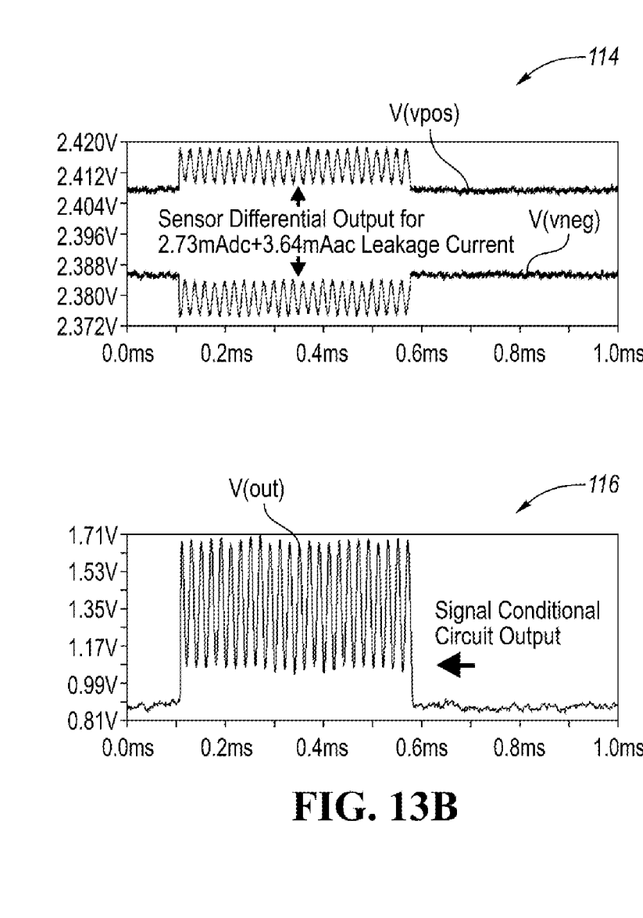

As shown in FIG. 13A, a leakage current in an EV charger of 9.1 milliamperes AC (at 50 Hertz) may result in sensor 20 producing differential output 110. Using operational amplifiers 100, the signal conditional circuit 26 of FIG. 11 may be configured to produce an output 112 shown in FIG. 13A reflecting, representing, or indicative of that DC leakage current of 2.73 milliamperes. Similarly, a leakage current in an EV charger of 2.73 milliamperes DC plus 3.64 milliamperes AC may result in sensor 20 producing a differential output 114 as shown in FIG. 13B. Using operational amplifiers 100, the signal conditional circuit 26 of FIG. 11 may be configured to produce an output 116 shown in FIG. 13B reflecting, representing, or indicative of that leakage current of 2.73 milliamperes DC plus 3.64 milliamperes AC. In that regard, the differential outputs 110, 114 may reflect, represent, or be indicative of a difference or imbalance between the currents carried by line input/output 30a, 30b (and/or line input/output 32a, 32b, and/or line input/output 34a, 34b) and neutral input/output 36a, 36b, which difference(s) or imbalance(s) may result from an AC and/or DC leakage current. (See, FIG. 1B.) Once again, any such difference(s) or imbalance(s) between the currents carried by the line input/output 30a, 30b (and/or line input/output 32a, 32b, and/or line input/output 34a, 34b) and the neutral input/output 36a, 36b creates a magnetic field in the gap 44 of the core 40, which magnetic field reflects, indicates, or is representative of an AC and/or DC leakage current. (See, FIG. 1B, 3.)

As is readily apparent from the foregoing, various non-limiting embodiments of an electric current sensor for detecting a leakage current from an electric vehicle charger have been described. Such embodiments provide an improved electric current sensor for detecting a leakage current from an electric vehicle charger configured to detect lower leakage current levels with lower cost.

While various embodiments have been illustrated and described herein, they are exemplary only and it is not intended that these embodiments illustrate and describe all those possible. Instead, the words used herein are words of description rather than limitation, and it is understood that various changes may be made to these embodiments without departing from the spirit and scope of the following claims.

What is claimed is:

1. An electric current sensor for detecting a leakage current from an electric vehicle charger, the current sensor comprising:
   a magnetic core having a gap formed therein;
   a first conductor wound around the magnetic core to form a first coil;
   a second conductor wound around the magnetic core to form a second coil;
   a tunnel-magnetoresistance (TMR) sensor element arranged in the gap of the magnetic core;
   wherein the magnetic core lacks a winding to drive the magnetic core to an expected condition, a difference between electric current flow in the first and second conductors produces a magnetic field in the gap of the magnetic core proportional to a leakage current, and the magnetic field produces a voltage in the TMR sensor element indicative of a value of the leakage current;
   a third conductor wound around the magnetic core to form a third coil; and
   a fourth conductor wound around the magnetic core to form a fourth coil;
   wherein a difference between current flow in the second and third conductors produces a second magnetic field in the gap of the magnetic core proportional to a second leakage current, and the second magnetic field produces a second voltage in the TMR sensor element indicative of a value of the second leakage current; and
   wherein a difference between current flow in the second and fourth conductors produces a third magnetic field in the gap of the magnetic core proportional to a third leakage current, and the third magnetic field produces a third voltage in the TMR sensor element indicative of a value of the third leakage current.

2. The electric current sensor of claim 1 wherein the magnetic core comprises a toroid having an outside diameter of 10 to 50 millimeters.

3. The electric current sensor of claim 1 wherein the magnetic core has an E-shape and a height of 39 to 41 millimeters.

4. The electric current sensor of claim 1 wherein the magnetic core has a C-shape and a height of up to 26 millimeters.

5. The electric current sensor of claim 1 wherein the magnetic core has a permeability of at least 800 Henries per meter.

6. The electric current sensor of claim 1 wherein the gap has a width of 2.5 to 3.5 millimeters.

7. The electric current sensor of claim 1 wherein the leakage current detected is a direct current or an alternating current having a value of up to 30 milliamperes.

8. The electric current sensor of claim 1 wherein the first coil comprises up to 50 turns of the first conductor around the magnetic core.

9. The electric current sensor of claim 1 wherein the second coil comprises up to 50 turns of the second conductor around the magnetic core.

10. The electric current sensor of claim 1 wherein each of the first and second conductors comprises a solid magnetic wire, polypropylene ethylene (PPE) coated wire, thermoplastic elastomer (TPE) coated wire, or polyvinyl chloride (PVC) coated wire.

11. The electric current sensor of claim 1 wherein the magnetic core comprises a nanocrystalline, silicon steel or ferrite material.

12. The electric current sensor of claim 1 wherein the first and second conductors are configured to carry an alternating current, the first conductor comprises a line input and a line output, and the second conductor comprises a neutral input and a neutral output.

13. The electric current sensor of claim 1 wherein the first, second, third, and fourth conductors are configured to carry alternating currents, each of the first, third, and fourth conductors comprises a line input and a line output, and the second conductor comprises a neutral input and a neutral output.

14. The electric current sensor of claim 1 further comprising:
   a signal conditional circuit provided in electrical communication with the TMR sensor element; and
   a housing for the signal conditional circuit, the TMR sensor element, and a first portion of the magnetic core having the gap formed therein, wherein a second portion of the magnetic core extends outside the housing and the housing provides magnetic shielding for the TMR sensor element;
   wherein, based on the voltage produced in the TMR sensor element, the signal conditional circuit generates an output signal representing the value of the leakage current, and wherein the leakage current value output signal is measurable at electrically conductive leads for the signal conditional circuit extending from the housing.

15. An electric current sensor for detecting a leakage current from an electric vehicle charger, the current sensor comprising:
   a magnetic core having a gap formed therein, the magnetic core having a permeability of at least 800 Henries per meter;
   a first conductor wound around the magnetic core to form a first coil;
   a second conductor wound around the magnetic core to form a second coil;
   a tunnel-magnetoresistance (TMR) sensor element arranged in the gap of the magnetic core;
   a signal conditional circuit provided in electrical communication with the TMR sensor element;
   a housing for the signal conditional circuit, the TMR sensor element, and at least a portion of the magnetic core having the gap formed therein;
   wherein the magnetic core lacks a winding to drive the magnetic core to an expected condition, a difference between electric current flow in the first and second conductors produces a magnetic field in the gap of the magnetic core proportional to a leakage current and the magnetic field produces a voltage in the TMR sensor element indicative of a value of the leakage current, and wherein, based on the voltage produced in the TMR sensor element, the signal conditional circuit generates an output signal representing the value of the leakage current and the leakage current value output signal is measurable at electrically conductive leads for the signal conditional circuit extending from the housing;

a third conductor wound around the magnetic core to form a third coil; and a fourth conductor wound around the magnetic core to form a fourth coil;

wherein a difference between current flow in the second and third conductors produces a second magnetic field in the gap of the magnetic core proportional to a second leakage current, and the second magnetic field produces a second voltage in the TMR sensor element indicative of a value of the second leakage current; and wherein a difference between current flow in the second and fourth conductors produces a third magnetic field in the gap of the magnetic core proportional to a third leakage current, and the third magnetic field produces a third voltage in the TMR sensor element indicative of a value of the third leakage current.

16. The electric current sensor of claim 15 wherein the magnetic core comprises a toroid having an outside diameter of 10 to 50 millimeters.

17. The electric current sensor of claim 15 wherein the magnetic core has an E-shape and a height of 39 to 41 millimeters, or a C-shaped and a height of up to 26 millimeters.

18. The electric current sensor of claim 15 wherein the gap has a width of 2.5 to 3.5 millimeters.

19. The electric current sensor of claim 15 wherein the leakage current detected is a direct current or an alternating current having a value of up to 30 milliamperes.

20. The electric current sensor of claim 15 wherein the first, second, third, and fourth conductors are configured to carry alternating currents, each of the first, third, and fourth conductors comprises a line input and a line output, and the second conductor comprises a neutral input and a neutral output.

* * * * *